United States Patent
Lee et al.

(10) Patent No.: US 11,523,551 B2
(45) Date of Patent: Dec. 6, 2022

(54) TESTING SYSTEM CAPABLE OF SHIELDING FROM ENVIRONMENT NOISE

(71) Applicants: Inventec (Pudong) Technology Corp., Shanghai (CN); Inventec Corporation, Taipei (TW)

(72) Inventors: Yung-Sen Lee, Taipei (TW); Yuan-Ho Chen, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 186 days.

(21) Appl. No.: 17/121,657

(22) Filed: Dec. 14, 2020

(65) Prior Publication Data

US 2022/0167534 A1 May 26, 2022

(30) Foreign Application Priority Data

Nov. 20, 2020 (CN) .......................... 202011305352.X

(51) Int. Cl.
*H05K 9/00* (2006.01)
*H05K 5/04* (2006.01)

(52) U.S. Cl.
CPC ............. *H05K 9/0049* (2013.01); *H05K 5/04* (2013.01)

(58) Field of Classification Search
None
See application file for complete search history.

(56) References Cited

U.S. PATENT DOCUMENTS

| | | | | |
|---|---|---|---|---|
| 5,136,119 A | * | 8/1992 | Leyland | H05K 9/0043 174/379 |
| 5,545,844 A | * | 8/1996 | Plummer, III | H05K 9/0043 174/363 |
| 2003/0058502 A1 | * | 3/2003 | Griffiths | G01R 33/283 398/139 |
| 2020/0132719 A1 | * | 4/2020 | Kuo | G01R 31/302 |

FOREIGN PATENT DOCUMENTS

CN 106405168 A 2/2017

* cited by examiner

*Primary Examiner* — James Wu
*Assistant Examiner* — Christopher L Augustin
(74) *Attorney, Agent, or Firm* — Winston Hsu

(57) ABSTRACT

A testing system capable of shielding from environment noise uses a foldable electromagnetic shielding box to isolate devices that will produce electromagnetic interference to a test object, so as to reduce the influence of these devices on the measurement of the test object. In an embodiment, measuring equipment and the test object are disposed in the foldable electromagnetic shielding box for being shielded from outside electromagnetic waves. In another embodiment, the measuring equipment is disposed in the foldable electromagnetic shielding box while the test object is disposed outside the foldable electromagnetic shielding box, so that the test object to be tested is shielded from electromagnetic waves from the measuring equipment. The foldable electromagnetic shielding box can be folded into a stack for convenience of storage or transport.

20 Claims, 6 Drawing Sheets

TESTING SYSTEM CAPABLE OF SHIELDING FROM ENVIRONMENT NOISE

BACKGROUND OF THE INVENTION

1. Field of the Invention

The present invention relates to a testing system capable of shielding from environment noise, and more particularly to a testing system using a foldable electromagnetic shielding box for shielding from environment noise.

2. Description of the Prior Art

The operation of some electronic devices may be affected by electromagnetic waves, and measurements performed on such electronic devices may also be affected by electromagnetic waves. Although the radio-frequency anechoic chamber can effectively shield electromagnetic waves, it is usually fixed and its usage is limited. In some cases (for example, the electronic device to be tested cannot be moved or is inconvenient to move into the radio-frequency anechoic chamber), it is difficult to shield the electronic device from environment noise (for example, electromagnetic waves from mobile phone base stations), which makes the measurement results distorted, and even failure. Furthermore, some measuring equipment itself also generates electromagnetic waves (such as USB, HDD read and write signals), so that even if the measurement is performed in a radio-frequency anechoic chamber, the measurement result still cannot accurately reflect the operation of the electronic device under test.

SUMMARY OF THE INVENTION

An objective of the invention is to provide a testing system capable of shielding from environment noise, which uses a foldable electromagnetic shielding box to isolate devices that will produce electromagnetic interference to a test object, so as to reduce the influence of these devices on the measurement of the test object.

According to an embodiment of the invention, a testing system capable of shielding from environment noise is used for measuring a test object and includes a foldable electromagnetic shielding box, a measuring equipment, and a remote control apparatus. The foldable electromagnetic shielding box is formed by a plurality of plates, so that the foldable electromagnetic shielding box is operable to be unfolded to form an isolated room for accommodating the test object and is operable to be folded into a stack for storage or transport. The foldable electromagnetic shielding box has a channel connected to the isolated room. The measuring equipment is disposed inside the isolated room for measuring the test object. The remote control apparatus is disposed outside the isolated room and connected to the measuring equipment through a cable to control operation of the measuring equipment. The cable passes through the channel. Thereby, the foldable electromagnetic shielding box can shield the test object from external electromagnetic waves.

According to another embodiment, a testing system capable of shielding from environment noise is used for measuring a test object and includes a radio-frequency anechoic chamber, a foldable electromagnetic shielding box, a measuring equipment, and a remote control apparatus. The foldable electromagnetic shielding box is disposed inside the radio-frequency anechoic chamber. The foldable electromagnetic shielding box is formed by a plurality of plates, so that the foldable electromagnetic shielding box is operable to be unfolded to form an isolated room and is operable to be folded into a stack for storage or transport. The foldable electromagnetic shielding box having a channel connected to the isolated room. The measuring equipment is disposed inside the isolated room for measuring the test object that is located inside the radio-frequency anechoic chamber and outside the isolated room. The remote control apparatus is disposed outside the radio-frequency anechoic chamber and connected to the measuring equipment through a cable to control operation of the measuring equipment. The cable passes through the channel. Thereby, the foldable electromagnetic shielding box can shield the test object from electromagnetic waves that may be generated by the measuring equipment.

Compared with the prior art, in the testing system capable of shielding from environment noise according to the invention, the foldable electromagnetic shielding box can isolate the test object (to avoid the influence of external electromagnetic waves) or the measuring equipment (to avoid the influence of electromagnetic waves that may be generated by the measuring equipment on the test object) according to actual measurement requirements, and furthermore can be folded into a stack for convenient storage or transport, which solves the problems in the prior art that the radio-frequency anechoic chamber cannot be moved to other places for electromagnetic wave shielding and cannot shielding from electromagnetic waves generated by measuring equipment inside.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
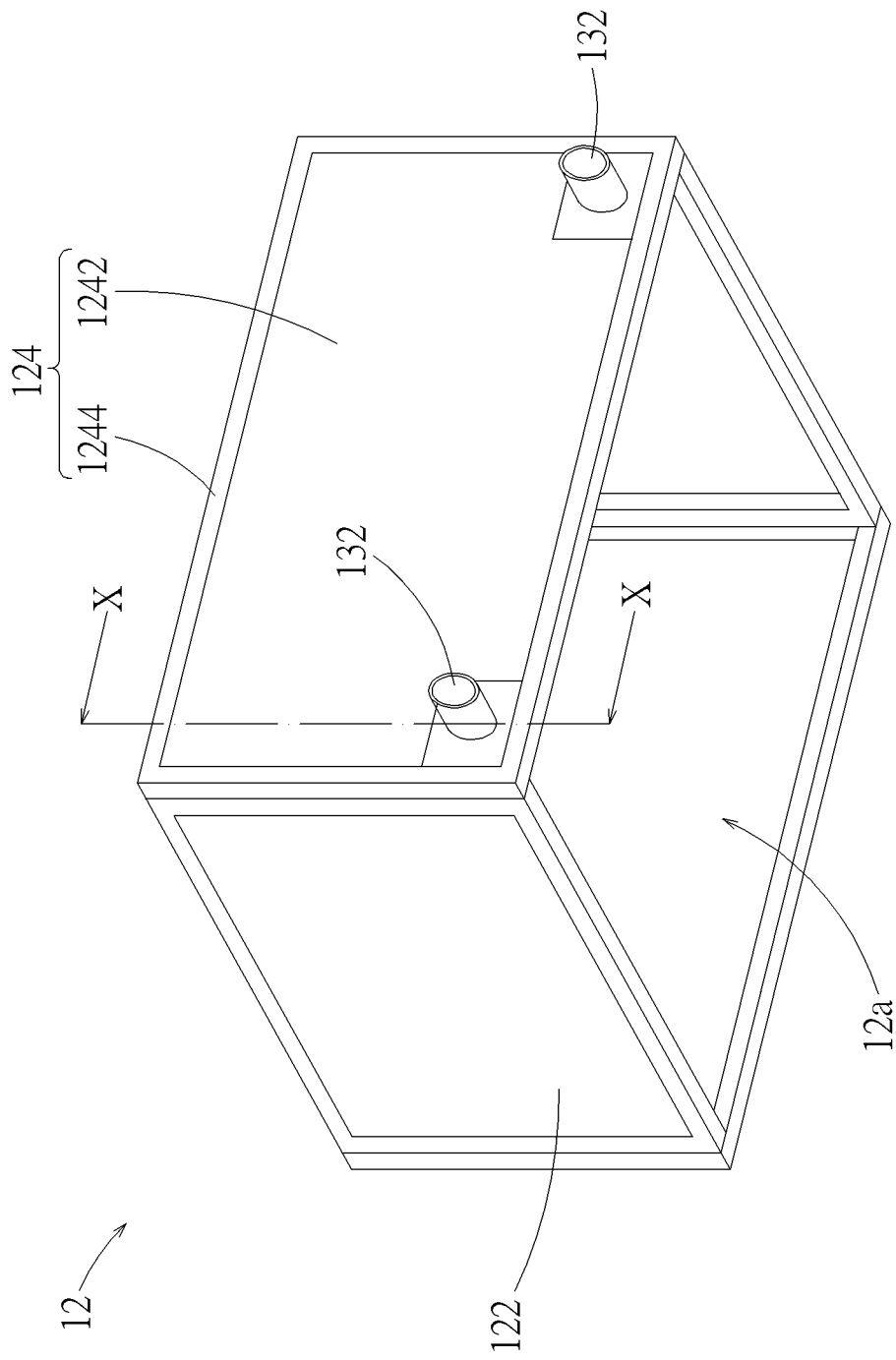
FIG. 1 is a schematic diagram illustrating a foldable electromagnetic shielding box according to an embodiment.
Figure 2:
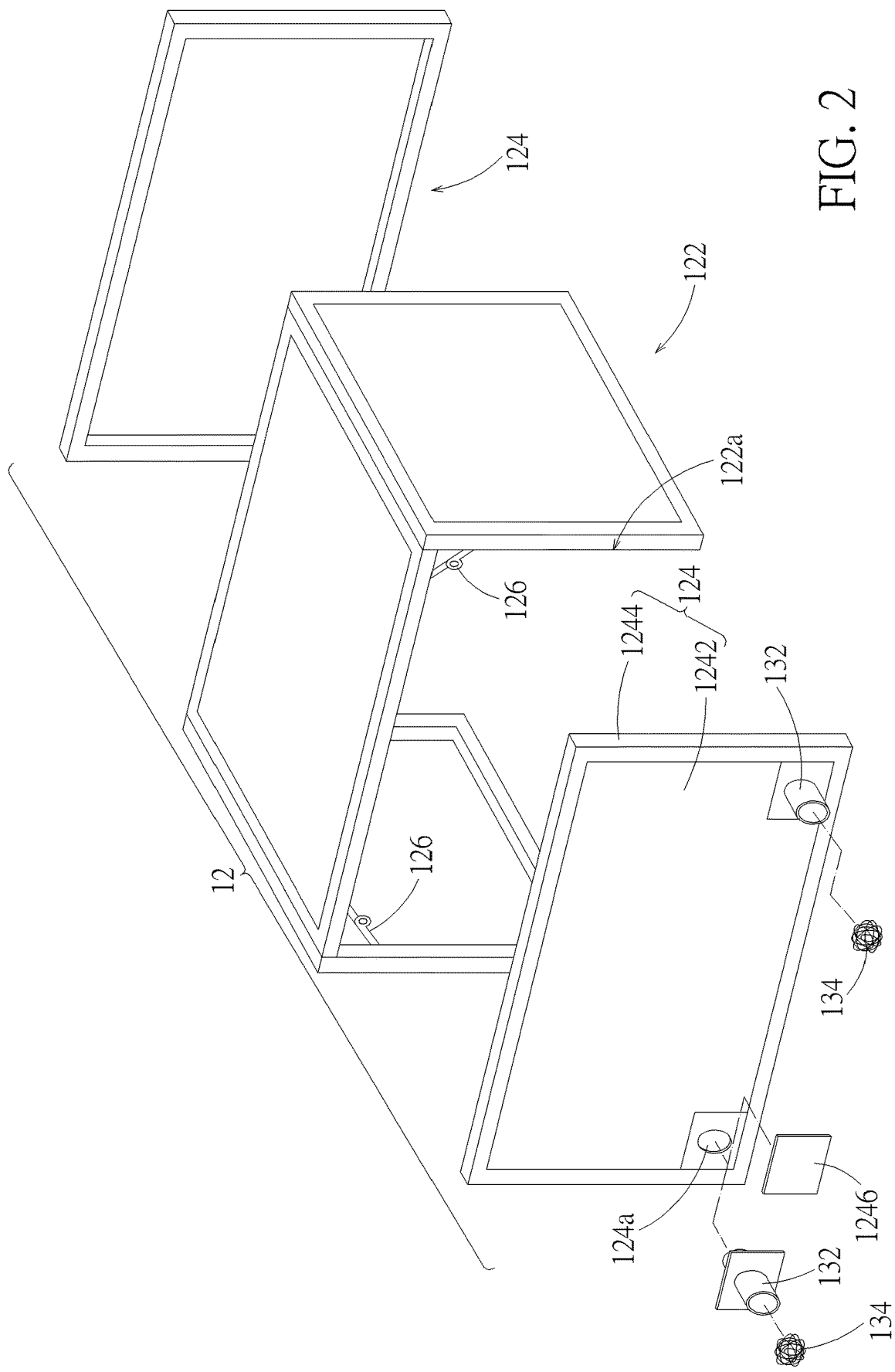
FIG. 2 is an exploded view of the foldable electromagnetic shielding box in FIG. 1.
Figure 3:
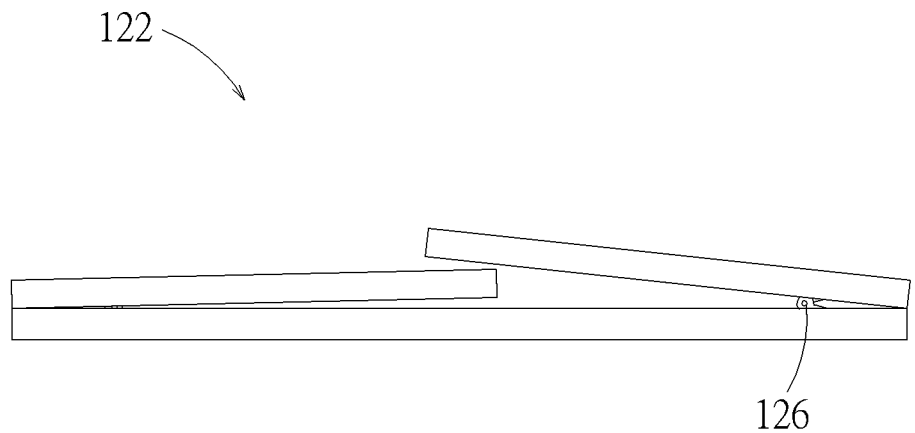
FIG. 3 is a schematic diagram illustrating a foldable n-shaped structure in FIG. 2 after folded.

Please refer to FIG. 1 and FIG. 2. A foldable electromagnetic shielding box 12 according to an embodiment includes a plurality of plates which include a foldable n-shaped structure 122 and two detachable plate members 124. The two detachable plate members 124 detachably close two side openings 122a of the foldable n-shaped structure 122 to form an isolated room 12a. Therein, the foldable n-shaped structure 122 includes three connected plates (for example but not limited by pivotal connection). The foldable n-shaped structure 122 can be unfolded to be n-shaped (as shown by FIG. 2) or folded (as shown by FIG. 3) through a plurality of foldable supports 126 connected to and between any adjacent two of the plates. The detachable plate members 124 can be connected with the unfolded foldable n-shaped structure 122 by hooking, locking, snapping and so on. Thereby, the foldable n-shaped structure 122 can be unfolded to form the isolated room 12a and can be folded into a stack for storage or transport. Therefore, the foldable electromagnetic shielding box 12 is portable through its foldable feature. Compared with a fixed radio-frequency anechoic chamber, the foldable electromagnetic shielding box 12 can be folded into a stack for storage, which does not take up space. The foldable electromagnetic shielding box 12 can also be folded into a stack for transport to other places and then assembled again, which increases the use efficiency.

Figure 4:
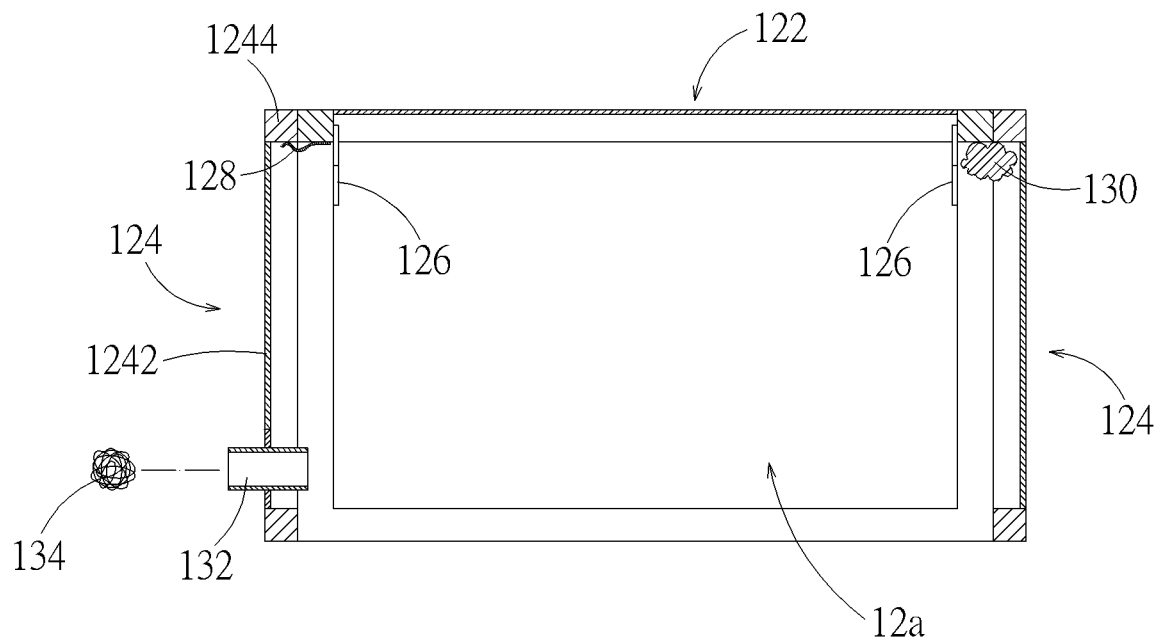
FIG. 4 is a sectional view of the foldable electromagnetic shielding box in FIG. 1 along the line X-X.

Furthermore, in practice, the plates of the foldable electromagnetic shielding box 12 can be achieved by the same or different structure. In the embodiment, every plate has the same structure logic. For example, the detachable plate member 124 includes a metal mesh 1242 (for example but not limited to a copper wire mesh or other meshes made of materials with good conductivity) and a metal frame 1244 (for example but not limited to a metal frame without anti-oxidation layer or frames made of other materials with good conductivity) fixed to periphery of the metal mesh 1242. The mesh diameter of the metal mesh 1242 (referring to the longest distance in the hole) may depend on actual applications. For example, the mesh diameter of the metal mesh 1242 can be but not limited to 0.64 mm. For another example, the mesh diameter of the metal mesh 1242 can be at least less than 2.5 mm (i.e. less than $\lambda/20$ at 6 GHz; therein, 6 GHz is the highest test frequency, and $\lambda$ is the wavelength at 6 GHz). For another example, the detachable plate member 124 can be achieved by a single metal plate. Furthermore, as shown by FIG. 4, in practice, a plurality of resilient metal pieces 128 (for example, one end of which is fixed to the foldable n-shaped structure 122) or conductive foam pieces 130 (for example, fixed to the foldable n-shaped structure 122) can be arranged on fringes of the two side openings 122a for simultaneously touching the two detachable plate members and the foldable n-shaped structure (for example, after fixed to the foldable n-shaped structure 122, the detachable plate members 124 elastically touch the resilient metal pieces 128 or the conductive foam pieces 130).

In the embodiment, the foldable electromagnetic shielding box 12 also includes at least one channel 132, connected to the isolated room 12a for devices inside and outside the foldable electromagnetic shielding box 12 to be connected. The quantity of the at least one channel 132 depends on actual applications. In the embodiment, the foldable electromagnetic shielding box 12 includes two channels 132, disposed at two corners of one side plate member of the plurality of plates (e.g. one of the detachable plate members 124). Furthermore, in the embodiment, the channel 132 is achieved by a waveguide tube. By designing the geometry of the waveguide (such as hole size, length, taper and so on), the degree of electromagnetic waves passing through the waveguide can be suppressed. The detachable plate member 124 forms a through hole 124a corresponding to one channel 132. The waveguide tube is detachably disposed in the through hole 124a. When the foldable electromagnetic shielding box 12 does not need to use the channel 132 or the number of the channel 132 needs to be reduced, the waveguide tube can be detached. A cover 1246 (for example but not limited to a metal plate) can be additionally used to detachably close to the through hole 124a. Furthermore, in practice, a metal brush ball 134 (for example but not limited to a stainless steel wire ball) can be used and squeeze into the channel 132 (for example, the outer diameter of the metal brush ball 134 is larger than the inner diameter of the waveguide tube), which can effectively fill the gap in the channel 132 (for example, the remaining space after the cable passes through the channel 132) to enhance the shielding effect of electromagnetic waves.

Figure 5:
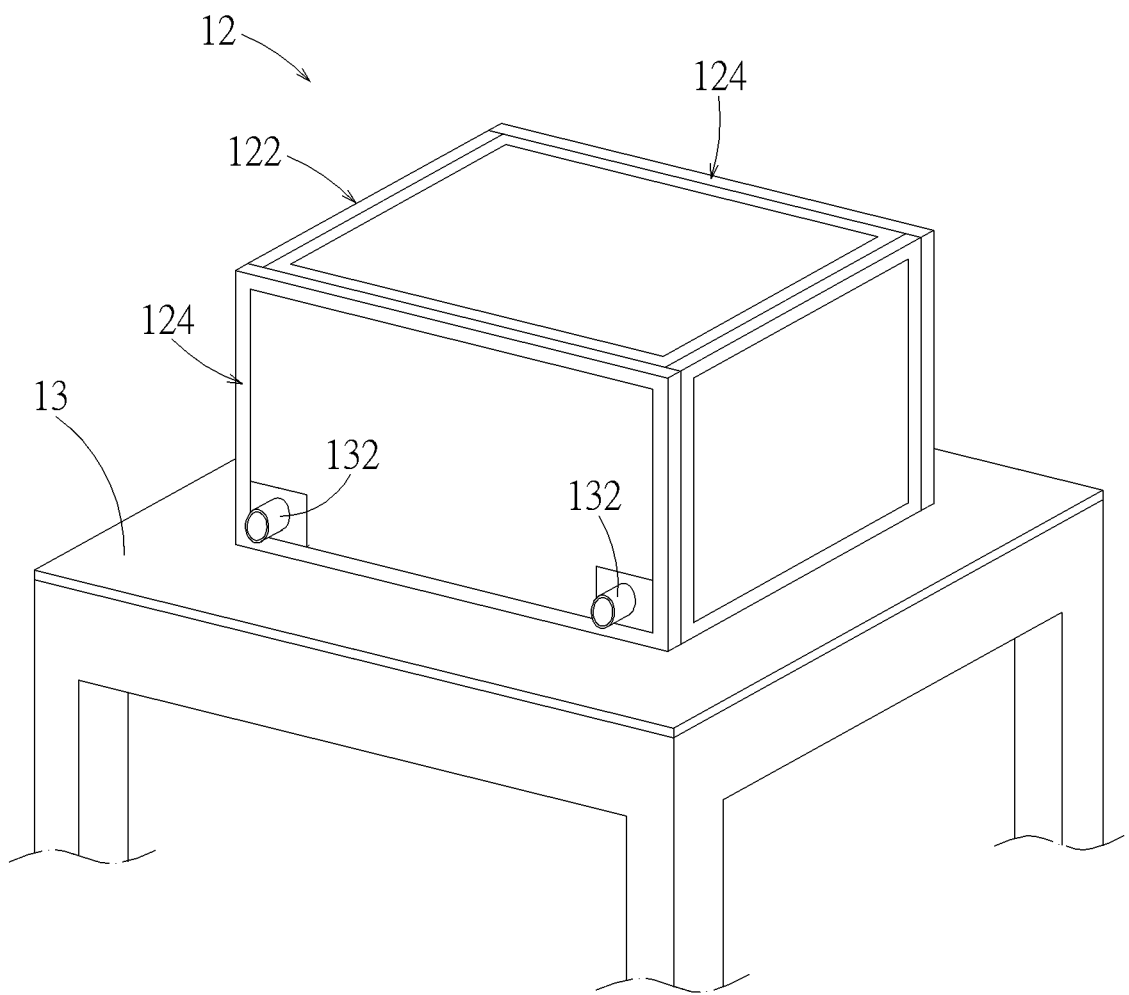
FIG. 5 is a schematic diagram illustrating the foldable electromagnetic shielding box in FIG. 2 on a work table.

In the embodiment, the foldable electromagnetic shielding box 12 can substantially prevent electromagnetic waves from entering or leaving the isolation room 12a. Therefore, in actual applications, the test object can be placed inside the isolated room 12a to be shielded from external electromagnetic waves; alternatively, the equipment that may generate electromagnetic interference can be placed inside the isolated room 12a while the test object can be placed outside the isolated room 12a, so as to shield the test object from electromagnetic waves from the equipment. Furthermore, as shown by FIG. 1, in general usage scenarios, there are few electromagnetic waves passing under the foldable electromagnetic shielding box 12, so although the foldable electromagnetic shielding box 12 has an opening below, the foldable electromagnetic shielding box 12 still can provide a good shielding effect of electromagnetic waves. In an actual application, as shown by FIG. 5, the foldable electromagnetic shielding box 12 can be placed on a grounded conductive plate 13 (for example but not limited to a work table with an anti-static rubber pad or a metal plate on the top) and close to the grounded conductive plate 13 to form the isolated room 12a, so that isolated Room 12a can effectively shield from electromagnetic waves in all directions. In addition, in practice, the foldable electromagnetic shielding box can also be modified in structure so that the foldable electromagnetic shielding box 12 itself can completely isolate the isolated room 12a. For example, the foldable n-shaped structure 122 is modified in structure to be a ring structure (or a rectangle structure), which is, for example, formed by four connected plates. During assembly, the plates at the head and tail are detachably connected to form the ring structure, and the two side openings are still covered by the two detachable plate members 124 to provide a completely isolated space.

Figure 6:
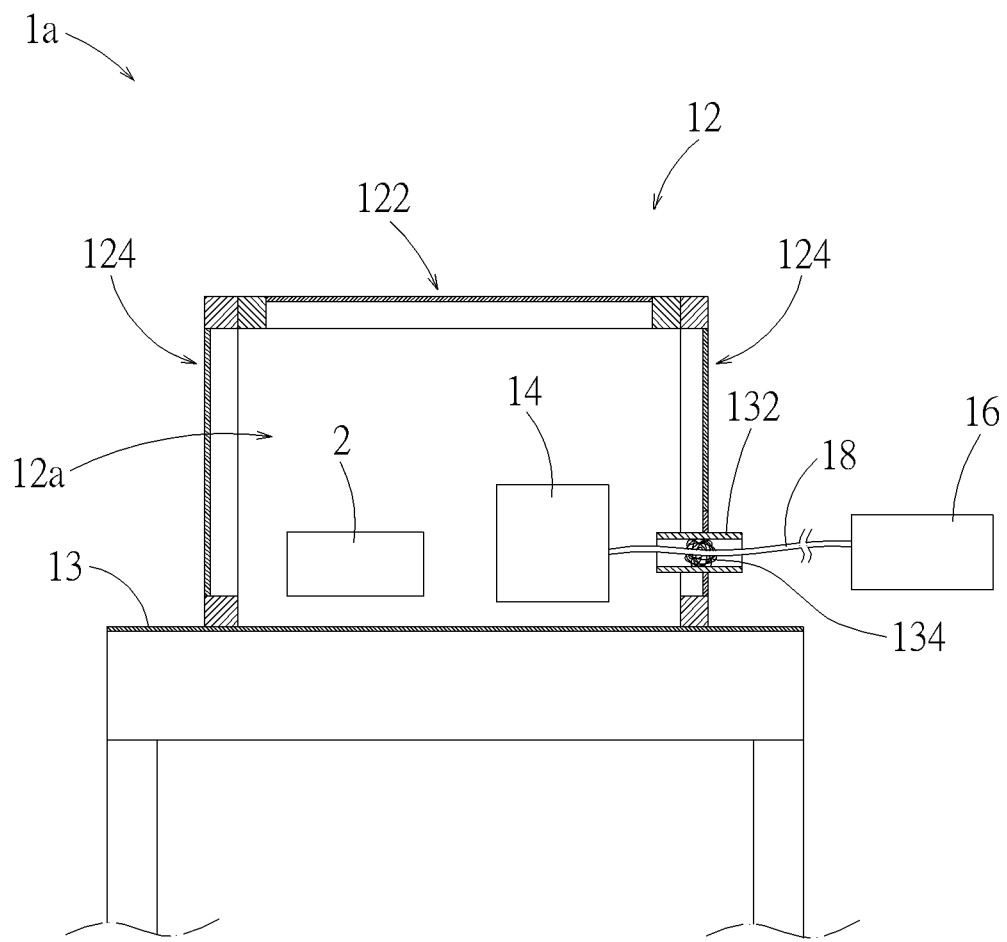
FIG. 6 is a schematic diagram illustrating a testing system capable of shielding from environment noise according to an embodiment.

Please refer to FIG. 6, which is a schematic diagram illustrating a testing system 1a capable of shielding from environment noise according to an embodiment. The testing system 1a uses the foldable electromagnetic shielding box 12. In the embodiment, the foldable electromagnetic shielding box 12 is placed on the grounded conductive plate 13. The testing system 1a also includes a measuring equipment 14 and a remote control apparatus 16 (which are shown by a single block respectively in the figure for drawing simplification). The measuring equipment 14 and a test object 2 (which are shown by a single block respectively in the figure for drawing simplification) are disposed together inside the isolated room 12a. The measuring equipment 14 is used for measuring the test object 2. The measuring equipment 14 is not limited to a single device, and can include multiple devices (including supporting devices) and can be connected to the test object 2 according to actual measurement requirements (for example, for meeting the test conditions of the test object 2). In practice, the test object 2 can be, for example but not limited to, a server or an in-vehicle electronic product. The remote control apparatus 16 (for example but not limited to a computer) is disposed outside the isolated room 12a and is connected to the measuring equipment 14 through a cable 18 for controlling the operation of the measuring equipment 14. The cable 18 passes through the channel 132. Thereby, the foldable electromagnetic shielding box 12 and the grounded conductive plate 13 can jointly provide effective electromagnetic shielding to the test object 2, so as to avoid interference from environment noise (for example, electromagnetic waves from mobile phone base stations) to the test object 2. Furthermore, in practice, the testing system 1a can also use a variation of the foldable electromagnetic shielding box 12 to provide the same or similar electromagnetic shielding effect to the test object 2, which will not be described in addition.

Figure 7:
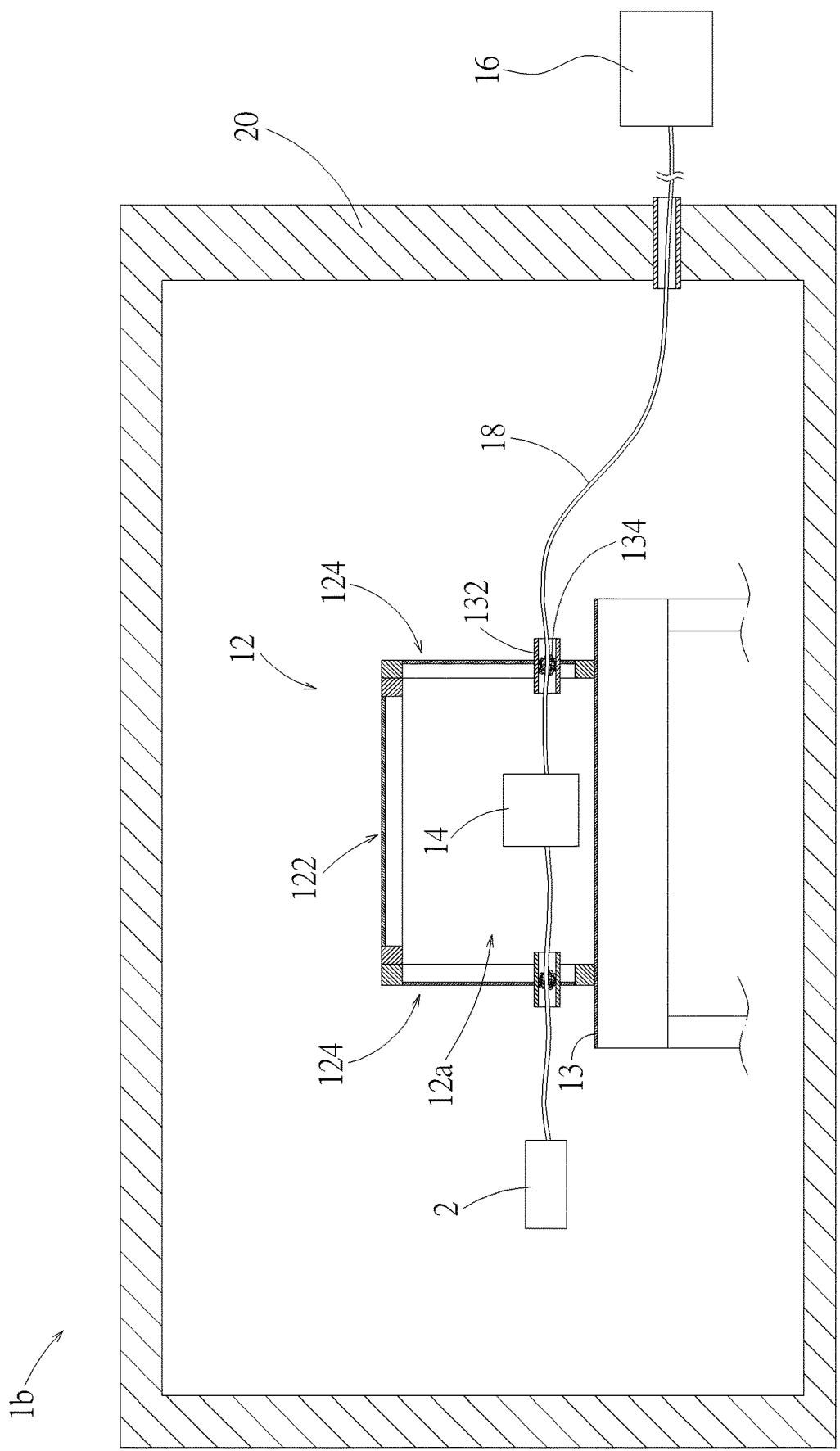
FIG. 7 is a schematic diagram illustrating a testing system capable of shielding from environment noise according to another embodiment.

Please refer to FIG. 7, which is a schematic diagram illustrating a testing system 1b capable of shielding from environment noise according to another embodiment. The testing system 1b uses the foldable electromagnetic shielding box 12. In the embodiment, the foldable electromagnetic shielding box 12 is placed on the grounded conductive plate 13. The testing system 1b also includes the measuring equipment 14, the remote control apparatus 16, and a radio-frequency anechoic chamber 20. The foldable electromagnetic shielding box 12, the measuring equipment 14, and the test object 2 are disposed inside the radio-frequency anechoic chamber 20; therein, the measuring equipment 14 is disposed inside the isolated room 12a while the test object 2 is disposed outside the isolated room 12a. The remote control apparatus 16 is disposed outside the radio-frequency anechoic chamber 20 and is connected to the measuring equipment 14 through the cable 18 for controlling the operation of the measuring equipment 14. The measuring equipment 14 can be connected to the test object 2 through the channel 132 according to the measurement requirements. For other descriptions about the measuring equipment 14 and the remote control apparatus 16, please refer to the relevant descriptions above, which will not be described in addition. Thereby, the foldable electromagnetic shielding box 12 and the grounded conductive plate 13 can jointly shield the test object 2 from electromagnetic waves (for example, USB, HDD reading and writing signals) that may be generated by the measuring equipment 14, so as to avoid electromagnetic interference from the measuring equipment 14 to the test object 2. Similarly, in practice, the testing system 1b can also use a variation of the foldable electromagnetic shielding box 12 to provide the same or similar electromagnetic shielding effect to the test object 2, which will not be described in addition. In addition, in practice, if the environment noise is too weak to affect the measurement of the test object 2, the radio-frequency anechoic chamber 20 can be omitted.

In actual applications, the testing systems 1a and 1b can reduce the radiation value by about 20 dB for mobile phone base station frequencies of 900 MHz and 1800 MHz.

Furthermore, the server (i.e. an example of the test object 2) can be used for artificial intelligence (AI) computing, edge computing, and can also be used as a 5G server, cloud server or car networking server. Furthermore, the in-vehicle electronic product (i.e. an example of the test object 2) can be applied to in-vehicle devices, such as self-driving cars, electric cars, semi-autonomous cars, and so on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testing system capable of shielding from environment noise, for measuring a test object, the testing system comprising:
a foldable electromagnetic shielding box, the foldable electromagnetic shielding box being formed by a plurality of plates, so that the foldable electromagnetic shielding box is operable to be unfolded to form an isolated room for accommodating the test object and is operable to be folded into a stack for storage or transport, the foldable electromagnetic shielding box having a channel connected to the isolated room;
a measuring equipment, disposed inside the isolated room for measuring the test object; and
a remote control apparatus, disposed outside the isolated room and connected to the measuring equipment through a cable to control operation of the measuring equipment, the cable passing through the channel.

2. The testing system capable of shielding from environment noise according to claim 1, wherein the foldable electromagnetic shielding box comprises a waveguide tube, the plurality of plates comprise a side plate member, the side plate member has a through hole, and the waveguide tube is disposed on the through hole to form the channel.

3. The testing system capable of shielding from environment noise according to claim 2, wherein the waveguide tube is detachably disposed on the side plate member.

4. The testing system capable of shielding from environment noise according to claim 3, wherein the foldable electromagnetic shielding box comprises a cover, for sealing the through hole when the waveguide tube is detached from the side plate member.

5. The testing system capable of shielding from environment noise according to claim 2, wherein the foldable electromagnetic shielding box comprises a metal brush ball squeezing into the channel.

6. The testing system capable of shielding from environment noise according to claim 1, wherein the plate comprises a metal mesh and a metal frame fixed to periphery of the metal mesh.

7. The testing system capable of shielding from environment noise according to claim 1, wherein the plurality of plates comprise a foldable n-shaped structure and two detachable plate members, the foldable n-shaped structure is foldable for storage, and the two detachable plate members detachably close two side openings of the foldable n-shaped structure to form the isolated room.

8. The testing system capable of shielding from environment noise according to claim 7, wherein the foldable electromagnetic shielding box comprises a plurality of resilient metal pieces, disposed at fringes of the two side openings for simultaneously touching the two detachable plate members and the foldable n-shaped structure.

9. The testing system capable of shielding from environment noise according to claim 7, wherein the foldable electromagnetic shielding box comprises conductive foam pieces, disposed at fringes of the two side openings for simultaneously touching the two detachable plate members and the foldable n-shaped structure.

10. The testing system capable of shielding from environment noise according to claim 7, further comprising a grounded conductive plate, the foldable electromagnetic shielding box after being unfolded is closely placed on the grounded conductive plate to form the isolated room.

11. A testing system capable of shielding from environment noise, for measuring a test object, the testing system comprising:
- a radio-frequency anechoic chamber;
- a foldable electromagnetic shielding box, disposed inside the radio-frequency anechoic chamber, the foldable electromagnetic shielding box being formed by a plurality of plates, so that the foldable electromagnetic shielding box is operable to be unfolded to form an isolated room and is operable to be folded into a stack for storage or transport, the foldable electromagnetic shielding box having a channel connected to the isolated room;
- a measuring equipment, disposed inside the isolated room for measuring the test object that is located inside the radio-frequency anechoic chamber and outside the isolated room; and
- a remote control apparatus, disposed outside the radio-frequency anechoic chamber and connected to the measuring equipment through a cable to control operation of the measuring equipment, the cable passing through the channel.

12. The testing system capable of shielding from environment noise according to claim 11, wherein the foldable electromagnetic shielding box comprises a waveguide tube, the plurality of plates comprise a side plate member, the side plate member has a through hole, and the waveguide tube is disposed on the through hole to form the channel.

13. The testing system capable of shielding from environment noise according to claim 12, wherein the waveguide tube is detachably disposed on the side plate member.

14. The testing system capable of shielding from environment noise according to claim 13, wherein the foldable electromagnetic shielding box comprises a cover, for sealing the through hole when the waveguide tube is detached from the side plate member.

15. The testing system capable of shielding from environment noise according to claim 12, wherein the foldable electromagnetic shielding box comprises a metal brush ball squeezing into the channel.

16. The testing system capable of shielding from environment noise according to claim 11, wherein the plate comprises a metal mesh and a metal frame fixed to periphery of the metal mesh.

17. The testing system capable of shielding from environment noise according to claim 11, wherein the plurality of plates comprise a foldable n-shaped structure and two detachable plate members, the foldable n-shaped structure is foldable for storage, and the two detachable plate members detachably close two side openings of the foldable n-shaped structure to form the isolated room.

18. The testing system capable of shielding from environment noise according to claim 17, wherein the foldable electromagnetic shielding box comprises a plurality of resilient metal pieces, disposed at fringes of the two side openings for simultaneously touching the two detachable plate members and the foldable n-shaped structure.

19. The testing system capable of shielding from environment noise according to claim 17, wherein the foldable electromagnetic shielding box comprises conductive foam pieces, disposed at fringes of the two side openings for simultaneously touching the two detachable plate members and the foldable n-shaped structure.

20. The testing system capable of shielding from environment noise according to claim 17, further comprising a grounded conductive plate, the foldable electromagnetic shielding box after being unfolded is closely placed on the grounded conductive plate to form the isolated room.

* * * * *